United States Patent
Lee et al.

(10) Patent No.: US 8,648,361 B2
(45) Date of Patent: Feb. 11, 2014

(54) ORGANIC LIGHT EMITTING DIODE DISPLAY

(75) Inventors: Dong-Kyu Lee, Yongin (KR); Gun-Shik Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 266 days.

(21) Appl. No.: 12/844,179

(22) Filed: Jul. 27, 2010

(65) Prior Publication Data

US 2011/0042697 A1    Feb. 24, 2011

(30) Foreign Application Priority Data

Aug. 18, 2009  (KR) .......................... 10-2009-0076415

(51) Int. Cl.
*H01L 29/20* (2006.01)
(52) U.S. Cl.
USPC .............................................. 257/89; 257/40
(58) Field of Classification Search
USPC ................................ 257/40, 89; 313/500–506
See application file for complete search history.

(56) References Cited

U.S. PATENT DOCUMENTS

| | | | |
|---|---|---|---|
| 7,023,013 B2 * | 4/2006 | Ricks et al. ...................... | 257/40 |
| 7,245,065 B2 | 7/2007 | Ghosh et al. | |
| 2003/0116758 A1 * | 6/2003 | Morii et al. ...................... | 252/582 |
| 2005/0040756 A1 * | 2/2005 | Winters et al. ................. | 313/504 |
| 2005/0146266 A1 * | 7/2005 | Kuma et al. ...................... | 313/506 |
| 2005/0280008 A1 * | 12/2005 | Ricks et al. ...................... | 257/79 |
| 2006/0102913 A1 * | 5/2006 | Park ................................ | 257/89 |
| 2006/0152151 A1 * | 7/2006 | Seo ................................. | 313/506 |
| 2007/0077349 A1 * | 4/2007 | Newman et al. ................ | 427/66 |
| 2008/0211399 A1 * | 9/2008 | Ryuji et al. ...................... | 313/506 |
| 2009/0015151 A1 * | 1/2009 | Ishihara et al. ................. | 313/504 |
| 2009/0102352 A1 * | 4/2009 | Cok et al. ........................ | 313/498 |

FOREIGN PATENT DOCUMENTS

| | | | |
|---|---|---|---|
| JP | 11-329742 | * | 11/1999 |
| JP | 2007265869 | | 10/2007 |
| JP | 2009007560 | | 1/2009 |
| KR | 1020020093169 A | | 12/2002 |
| KR | 1020060021602 A | | 3/2006 |
| KR | 1020070050785 A | | 5/2007 |
| KR | 1020080079993 A | | 9/2008 |

OTHER PUBLICATIONS

Machine translated document (JP 11-329742, Nov. 1999).*

* cited by examiner

*Primary Examiner* — A. Sefer
(74) *Attorney, Agent, or Firm* — Robert E. Bushnell, Esq.

(57) ABSTRACT

An organic light emitting diode display includes a display substrate including a plurality of organic light emitting diodes, a plurality of color filters on the plurality of organic light emitting diodes respectively corresponding thereto, and a plurality of light scattering particles dispersed in the plurality of color filters.

17 Claims, 4 Drawing Sheets

ORGANIC LIGHT EMITTING DIODE DISPLAY

CLAIM OF PRIORITY

This application makes reference to, incorporates the same herein, and claims all benefits accruing under 35 U.S.C §119 from an application entitled ORGANIC LIGHT EMITTING DIODE DISPLAY earlier filed in the Korean Industrial Property Office on Aug. 18, 2009, and there duly assigned Serial No. 10-2009-0076415 by that Office.

BACKGROUND OF THE INVENTION

1. Field of the Invention

The described technology relates generally to an organic light emitting diode (OLED) display. More particularly, the described technology relates generally to an OLED display of which light extraction efficiency is improved.

2. Description of the Related Art

An organic light emitting diode (OLED) display is a self emissive display device that is displays images with organic light emitting diodes. The organic light emitting diode display differs from a liquid crystal display (LCD) in that it does not require a separate light source, and has a relatively small thickness and weight. Furthermore, as the organic light emitting diode display involves high quality characteristics such as low power consumption, high luminance, and short response time, it is spotlighted as a next generation display device for portable electronic appliances.

Usually, one or more electrodes of the organic light emitting diodes in the organic light emitting diode display, and other various metal wires thereof, reflect external light that is incident thereto from the outside. Accordingly, when the organic light emitting diode display is used in bright areas, the black color expression and the contrast thereof become poor due to the reflection of external light.

In order to solve such a problem, polarizing and phase retardation plates are provided on the organic light emitting diode so as to suppress the reflection of external light. However, with the conventional method of suppressing the reflection of external light based on the polarizing and phase retardation plates, it is problematic that much light generated from an organic emissive layer is eliminated when the external light is discharged to the outside through the polarizing and phase retardation plates.

The above information disclosed in this Background section is only for enhancement of understanding of the background of the described technology and therefore it may contain information that does not form the prior art that is already known in this country to a person of ordinary skill in the art.

SUMMARY OF THE INVENTION

The described technology has been made in an effort to provide an OLED display having advantages of effectively suppressing reflection of external light and simultaneously improving light extraction efficiency of light emitted from an organic light emitting diode.

An OLED display according to an exemplary embodiment includes a display substrate including a plurality of organic light emitting diodes, a plurality of color filters on the plurality of organic light emitting diodes respectively corresponding thereto, and a plurality of light scattering particles dispersed in the plurality of color filters.

The color filter includes a binder and a pigment, and the light scattering particles may be made of a material having a relatively low refractive index compared to the binder.

The light scattering particles may be inorganic particles.

The display substrate further includes a substrate main body divided into a plurality of pixel areas spaced apart from each other by a distance and a non-pixel area formed around the plurality of pixel areas, and the plurality of organic light emitting diodes may be respectively disposed at each of the plurality of pixel areas.

The OLED display may further include a light blocking member disposed in the non-pixel area of the substrate main body corresponding thereto.

The plurality of color filters may be formed on a layer where the light blocking member is formed.

The organic light emitting diode has a structure in which a first electrode, an organic emissive layer, and a second electrode is sequentially stacked, and the second electrode may be most closely disposed to the color filter.

The first electrode includes a reflective layer, and the second electrode may include a semi-transparent layer.

At least one of the plurality of organic light emitting diodes may further include a cavity layer disposed between the first and second electrodes.

The plurality of organic light emitting diodes may include a first organic light emitting diode emitting light of a red-based color, a second organic light emitting diode emitting light of a green-based color, and a third organic light emitting diode emitting light of a blue-based color.

Each of the first and second organic light emitting diodes further includes a cavity layer, and the thickness of the cavity layer of the first organic light emitting diode may be greater than that of the cavity layer of the second organic light emitting diode.

The plurality of color filters may have colors of which bases are the same as those of colors of light emitted from the respectively corresponding organic light emitting diodes.

The OLED display further includes an encapsulation substrate separately disposed on the display substrate and sealed therewith, and the plurality of color filters may be formed in the encapsulation substrate.

The OLED display may further include a thin encapsulation layer filling a gap between the organic light emitting diode and the color filter.

The thin encapsulation layer may include at least one of inorganic films and at least one of organic films.

The thin encapsulation layer may have a structure in which the inorganic film and the organic film are alternately stacked.

The inorganic film may be most closely disposed to the organic light emitting diode among the inorganic film and the organic film.

According to the exemplary embodiment, the OLED display can effectively suppress reflection of external light and simultaneously improve the light extraction rate of light emitted from the organic light emitting diode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
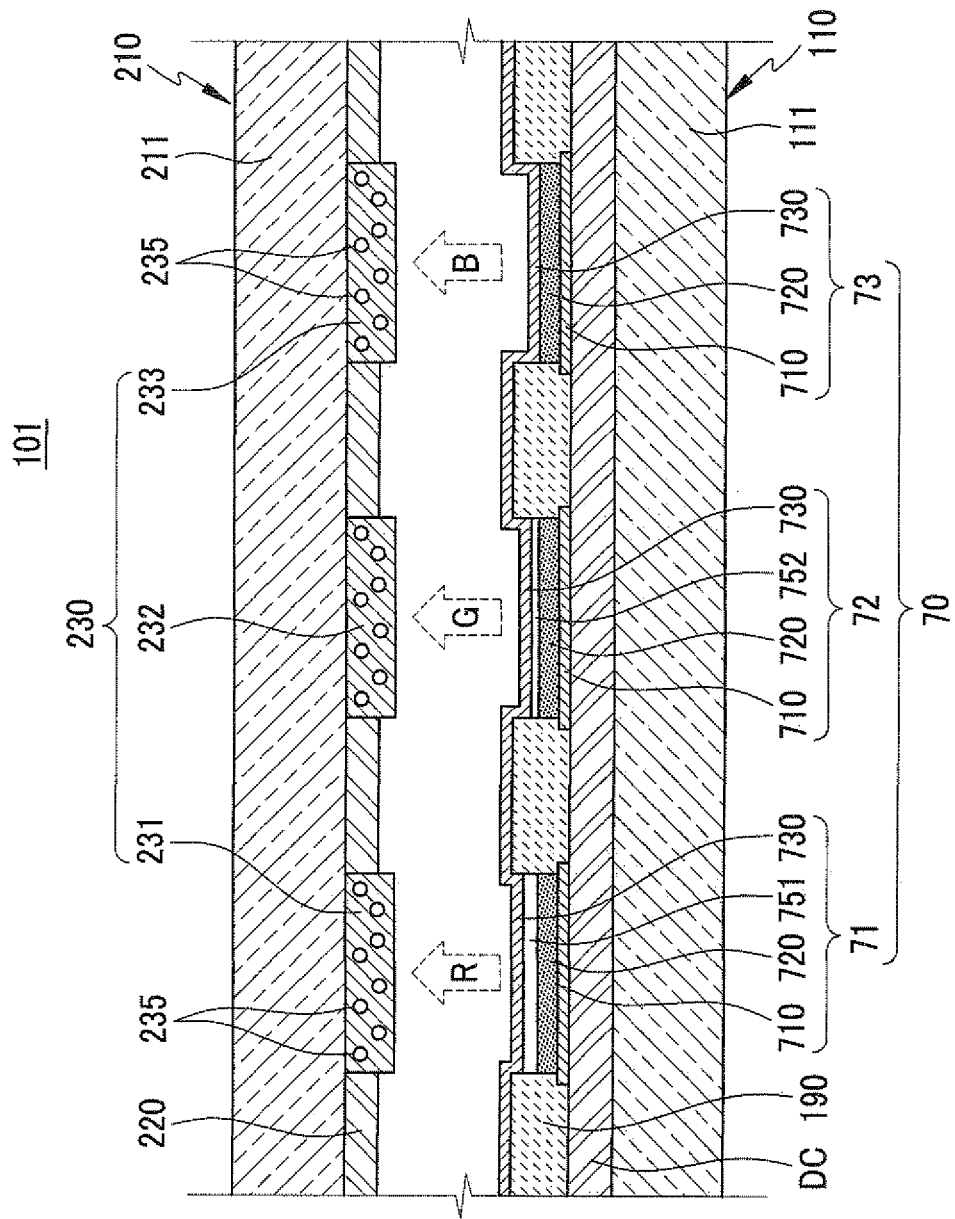
FIG. 1 is a cross-sectional view of an organic light emitting diode (OLED) display according to a first exemplary embodiment.

The present invention will be described more fully hereinafter with reference to the accompanying drawings, in which exemplary embodiments of the invention are shown. As those is skilled in the art would realize, the described embodiments may be modified in various different ways, all without departing from the spirit or scope of the present invention.

Furthermore, with exemplary embodiments, detailed description is given for the constituent elements in the first exemplary embodiment with reference to the relevant drawings by using the same reference numerals for the same constituent elements, while only different constituent elements from those related to the first exemplary embodiment are described in other exemplary embodiments.

Parts that are irrelevant to the description are omitted in order to clearly describe the present invention, and like reference numerals designate like elements throughout the specification.

Furthermore, as the size and thickness of the respective structural components shown in the drawings are arbitrarily illustrated for explanatory convenience, the present invention is not necessarily limited to as illustrated.

In the drawings, the thickness of layers, films, panels, regions, etc., are exaggerated for clarity and explanatory convenience. It will be understood that when an element such as a layer, film, region, or substrate is referred to as being "on" another element, it can be directly on the other element or intervening elements may also be present.

Hereinafter, a first exemplary embodiment will be described with reference to FIG. 1.

As shown in FIG. 1, an organic light emitting diode (OLED) display 101 according to the first exemplary embodiment includes a display substrate 110 and an encapsulation substrate 210 sealed with the display substrate 110 in a vacuum-tight manner.

The display substrate 110 includes a first substrate main body 111, a driving circuit (DC), and a plurality of organic light emitting diodes 70.

The first substrate main body 111 may be formed of an insulative substrate made of glass, quartz, ceramic, or plastic. However, an exemplary embodiment is not limited thereto, and the first substrate main body 111 may be formed with a metallic material such as stainless steel.

The first substrate main body 111 is divided into a plurality of pixel areas spaced apart from each other by a distance and a non-pixel area formed around the plurality of pixel areas.

The driving circuit DC is formed on the first substrate main body 111. The driving circuit DC includes thin film transistors 10 and 20 (shown in FIG. 2), and drives the organic light emitting diodes 70. That is, the organic light emitting diodes 70 emit light according to a driving signal received from the driving circuit DC to display images.

Figure 2:
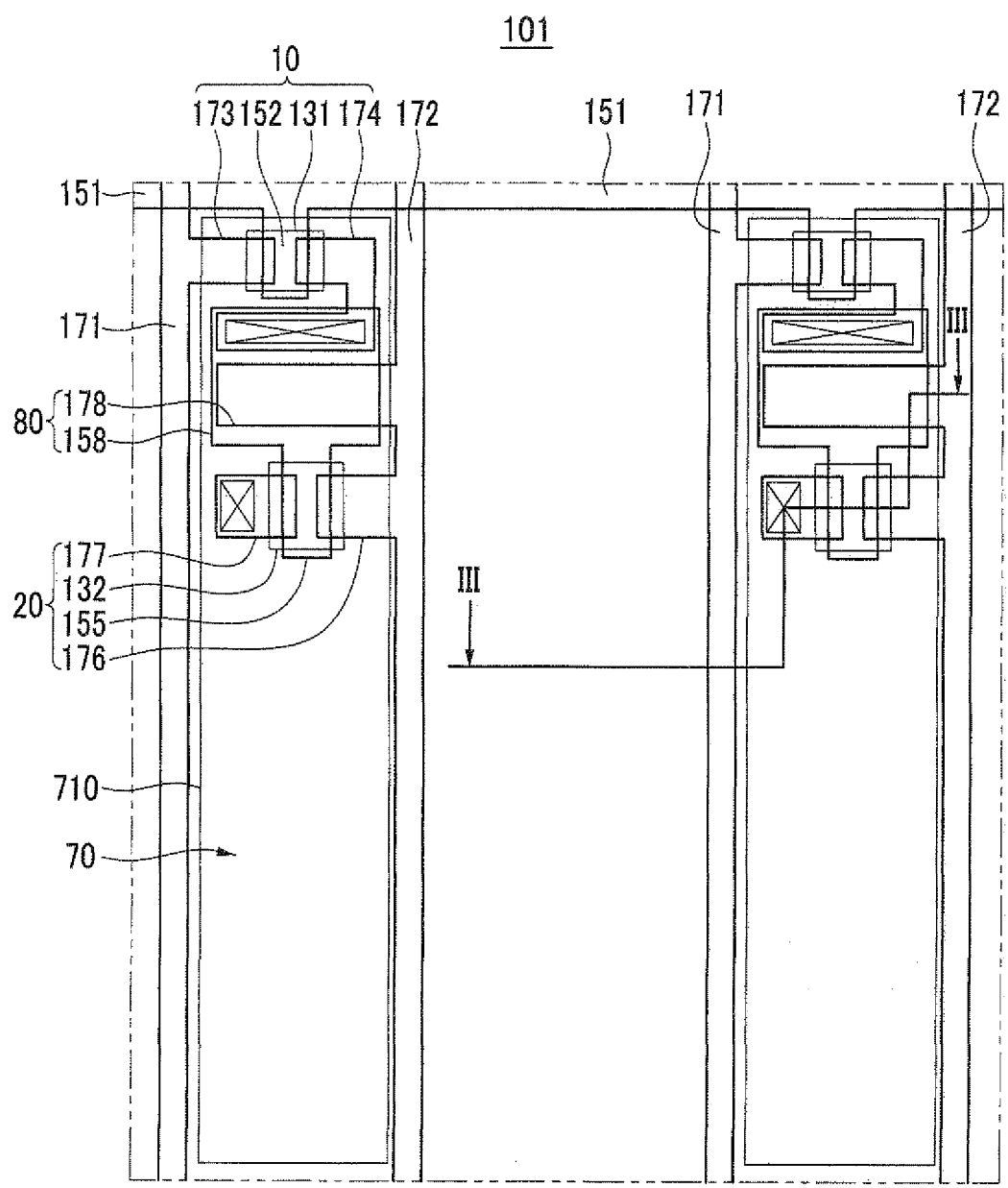
FIG. 2 is an enlarged layout view of an internal structure of the OLED display of FIG. 1.
Figure 3:
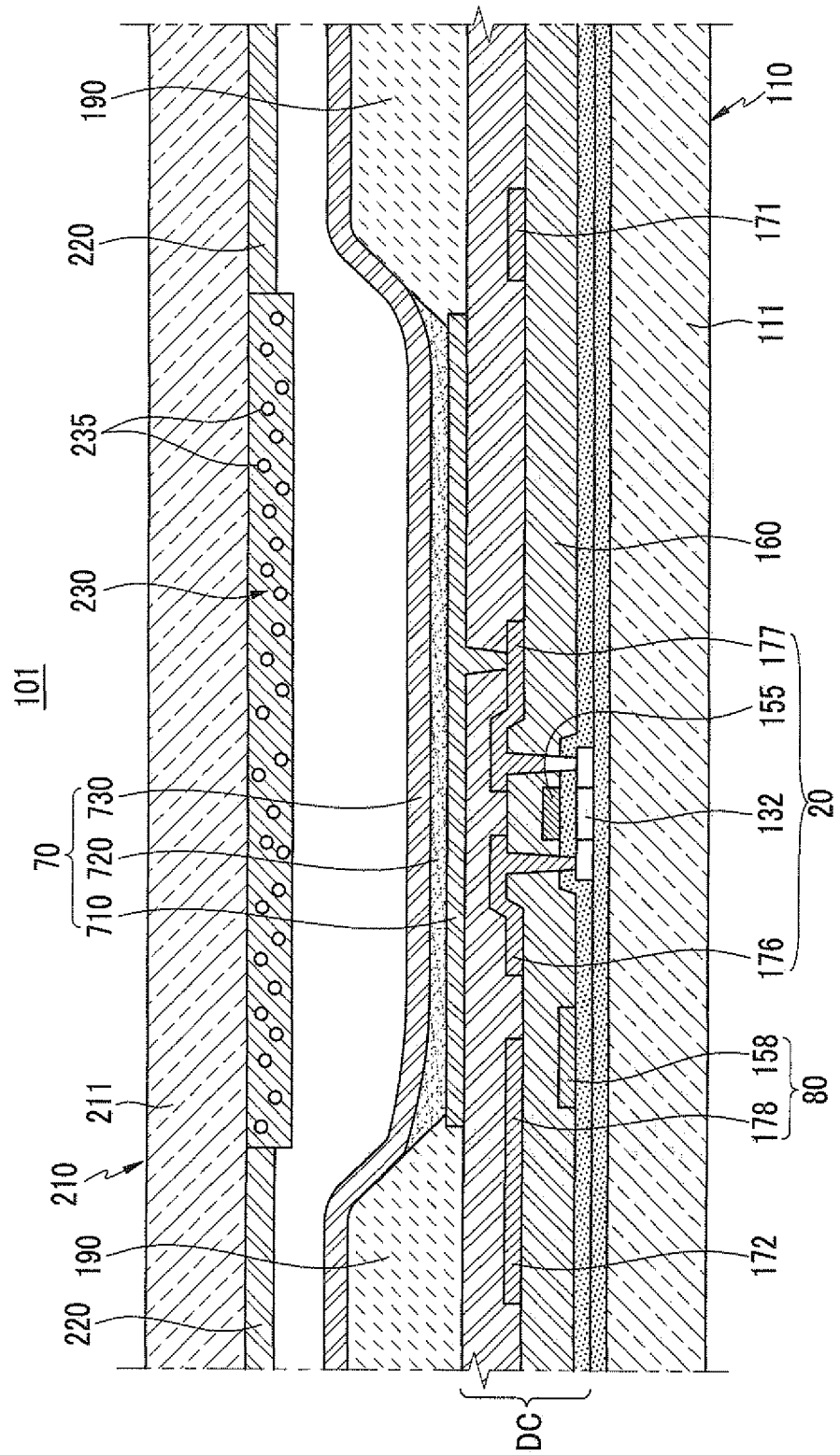
FIG. 3 is a cross-sectional view of FIG. 2, taken along the line.

A detailed structure of the driving circuit DC is shown in FIG. 2 and FIG. 3, but the structure of the first exemplary embodiment is not limited to the structure thereof. The driving circuit DC may be variously formed to the extent that such a structure can be easily embodied by a person of ordinary skill in the art.

The plurality of organic light emitting diodes 70 are provided at each of the plurality of pixel areas to emit light according to the driving signal received from the driving circuit DC. The organic light emitting diodes 70 includes a first electrode 710 which is an anode, a second electrode 730 which is a cathode, and an organic emission layer 720 disposed between the first and second electrodes 710 and 720. However, the first exemplary embodiment is not limited thereto. That is, the first electrode 710 may be the cathode and the second electrode 730 may be the anode.

The first electrode 710, the organic emission layer 720, and the second electrode 730 are sequentially stacked on the pixel area of the first substrate main body. In addition, the second electrode 730 of the organic light emitting diode 70 is disposed closest to a color filter 230.

The first electrode 710 is formed of a reflective layer and the second electrode 730 is formed of a semi-transparent layer. Accordingly, the light generated from the organic emissive layer 720 is discharged through the second electrode 730. That is, in the first exemplary embodiment, the OLED display 101 is structured as a front emission type.

The reflective layer and the semi-transparent layer are formed with one or more metallic materials selected from magnesium (Mg), silver (Ag), gold (Au), calcium (Ca), lithium (Li), chromium (Cr), and aluminum (Al), or alloys thereof. The reflective layer and the semi-transparent layer are determined depending upon the thickness thereof. The semi-transparent layer has a thickness of 200 nm or less. When the thickness of the semi-transparent layer becomes smaller, the light transmission thereof is increased, whereas when the thickness of the semi-transparent layer becomes larger, the light transmission thereof is decreased.

Furthermore, the first electrode 710 may contain a transparent conductive layer. That is, the first electrode 710 may have a multi-layered structure with a reflective layer and a transparent conductive layer. The transparent conductive layer may be formed with indium tin oxide (ITO), indium zinc oxide (IZO), zinc oxide (ZnO), or indium oxide (In2O3). The transparent conductive layer has a relatively high work function, and is disposed between the reflective layer and the organic emissive layer 720.

The organic emissive layer 720 has a multi-layered structure (not shown) including an emissive layer, a hole injection layer (HIL), a hole transporting layer (HTL), an electron transporting layer (ETL), and an electron injection layer (EIL). When the organic emissive layer 720 has all the above components, the hole injection layer (HIL) is disposed on the first electrode 710 being the anode, and the hole transporting layer (HTL), the emissive layer, the electron transporting layer is (ETL), the electron injection layer (EIL) are sequentially deposited thereon. Furthermore, when needed, the organic emissive layer 720 may include other layers.

The plurality of organic light emitting diodes 70 respectively emit light of at least one of two or more colors. In the first exemplary embodiment, the plurality of organic light emitting diodes 70 include a first organic light emitting diode 71 emitting light of a red-based color R, a second organic light emitting diode 72 emitting light of a green-based color G, and a third organic light emitting diode 73 emitting light of a blue-based color B. However, the first exemplary embodiment is not limited thereto. That is, the organic light emitting diode 70 may emit light of a color that is different from the above stated colors.

The first organic light emitting diode 71 and the second organic light emitting diode 72 each respectively further include cavity layers 751 and 752 respectively disposed between the first and second electrodes 710 and 730. That is, the first organic light emitting diode 71 and the second organic light emitting diode 72 respectively include the first electrode 710, the organic emission layer 720, the cavity layers 751 and 752, and the second electrode 730, whereas the third organic light emitting diode 73 includes only the first electrode 710, the organic emission layer 720, and the second electrode 730. In addition, the thickness of the cavity layer 751 of the first organic light emitting diode 71 is greater than that of the cavity layer 752 of the second organic light emitting diode 72. The third organic light emitting diode 73 may have the relatively thinnest cavity layer as necessary.

The OLED display 101 improves luminance of light emitted from the organic light emitting diode 70 by using a microcavity effect. The microcavity effect may be optimized by controlling the distance between the first and second electrodes 710 and 730 of the organic light emitting diodes 70. The distance between the first and second electrodes 710 and 730 that is required for optimizing the microcavity effect may be changed according to a color of light emitted from the organic light emitting diodes 70.

In further detail, the first organic light emitting diode 71 that emits light of a red-based color has the relatively largest distance between the first and second electrodes 710 and 730, and the third organic light emitting diode 73 that emits light of a blue-based color has the relatively smallest distance.

Therefore, the cavity layers 751 and 752 are respectively disposed between the first and second electrodes 710 and 730 of the first and second organic light emitting diodes 71 and 72 as described above so as to effectively improve luminance efficiency with respect to power.

Furthermore, at least one of the hole injection layer (HIL), the hole transport layer (HTL), the electron transport layer (ETL), and the electron injection layer (EIL) of the organic emission layers 720 of the first and second organic light emitting diodes 71 and 72 may be used as a cavity layer by forming the layer to be thick. Alternatively, a transparent conductive layer of the first electrodes 710 of the first and second organic light emitting diodes 71 and 72 may be used as the cavity layer by forming the layer to be thick.

However, the structure of the organic light emitting diodes 70 of the first exemplary embodiment is not limited thereto. The organic light emitting diode 70 may be variously structured to the extent that such a structure can be easily embodied by a person of ordinary skill in the art. The display substrate 110 further includes a pixel defining layer 190. The pixel definition layer 190 has an opening exposing the first electrode 710 of the organic light emitting diode 70. That is, the pixel defining layer 190 corresponds to a non-pixel area of the first substrate main body 111, and the opening of the pixel defining layer 190 corresponds to a pixel area of the first substrate main body 111.

The encapsulation substrate 210 includes a second substrate main body 211, a light blocking member 220, a plurality of color filters 230, and a plurality of light scattering particles 235.

The second substrate main body 211 may be formed of a transparent insulative substrate made of glass, quartz, ceramic, or plastic. The second substrate main body 211 is separately formed on the organic light emitting diode 70.

The light blocking member 220 is formed on the second substrate main body 211, and is disposed in an area corresponding to the non-pixel area of the first substrate main body 111. That is, the light blocking member 220 faces the pixel defining layer 190 of the display substrate 110.

The light blocking member 220 may be formed by depositing a metal or a metal compound and etching the same. In this case, the metal may include chromium (Cr), and the metal compound may include chromium oxide (CrOx) and chromium nitride (CrNx).

In addition, the light blocking member 220 may be formed by coating an opaque light sensitive organic material and then performing a photolithography process. Here, the opaque light sensitive organic material may include carbon black, a pigment mixture, or a dye mixture.

The plurality of color filters 230 are formed on the second substrate main body 211, and disposed in an area corresponding to the pixel area of the first substrate main body 111. That is, the plurality of color filters 230 respectively face the plurality of organic light emitting diodes 70. Furthermore, the plurality of color filters 230 respectively have colors of which bases are the same as those of colors of light emitted from the respectively corresponding organic light emitting diodes 70.

In further detail, the plurality of color filters 230 include a first color filter 231 facing the first organic light emitting diode 71, a second color filter 232 facing the second organic light emitting diode 72, and a third color filter 233 facing third organic light emitting diode 73. The first color filter 231 has a red-based color, the second color filter 232 has a green-based color, and the third color filter 233 has a blue-based color.

The color filter 230 prevents a light defect due to mixture of external light with light emitted from the organic light emitting diode 70. Furthermore, the light blocking member 220 blocks external light that is unnecessarily incident upon the OLED display 101 from the outside, and the color filter 230 absorbs unnecessary light of colors excluding the colors of the color filter 230. Therefore, the OLED display 101 formed as a front emission type according to the first exemplary embodiment can effectively suppress reflection of external light through the color filter 230 and the light blocking member 220.

The color filter 230 is formed at the same layer where the light blocking member 220 is formed. In FIG. 1, the color filter 230 and the light blocking member 220 are formed on one side of the second substrate main body 211, facing the organic light emitting diodes, but the first exemplary embodiment is not limited thereto. That is, the color filter 230 and the light blocking member 220 may be formed on the other side to the side that faces the organic light emitting diode 70.

The color filter 230 includes a binder and a pigment. That is, the color filter 230 is formed of a material mixed with the binder and the pigment. Furthermore, a plurality of light scattering particles 235 are dispersed in the plurality of color filters 230. Here, the light scattering particles 235 are formed of a material having a relatively lower refractive index than that of the binder of the color is filter 230. For example, the light scattering particles 235 may be inorganic particles such as a silicon oxide ($SiO_2$) having a low refractive index.

The light scattering particles 235 suppress occurrence of total reflection by scattering light inside the color filter 230. Therefore, the light scattering particles 235 improve the light extraction efficiency rate by suppressing light loss due to total reflection when the light emitted from the organic light emitting diode 70 passes through the color filter 230.

The size and density of the light scattering particles 235 are determined in consideration of a wavelength of the light passing through the color filter 230. Rayleigh scattering occurs when the size of the light scattering particles 235 is greater than the wavelength of the light, and the occurrence is more pronounced as the wavelength of the light is decreased. For example, when the size of the light scattering particle 235 is 100 nm, light of a red-based color having a wavelength of approximately 470 nm is more scattered in the color filter 230 than light of a blue-based color having a wavelength of approximately 600 nm. Furthermore, the scattering is more pronounced as the density of the light scattering particle 235 is increased.

Accordingly, the size and density of the light scattering particles 235 are controlled in consideration of efficiency of the organic light emitting diodes 70 for each color.

In FIG. 1, a dotted line arrow represents a light proceeding direction, and reference numerals R, G, and B respectively represent initials of colors emitted from the respective organic light emitting diodes 70. That is, R represents a red color, G represents a green color, and B represents a blue color.

In addition, although it is not illustrated, the OLED display 101 further includes a sealant disposed between the display substrate 110 and the encapsulation substrate 210 along the edges of is the display substrate 110 and the encapsulation substrate 210 to seal the two substrates 110 and 210 to each other.

With such a configuration, the OLED display 101 according to the first exemplary embodiment can effectively suppress reflection of external light. Simultaneously, the OLED display 101 can generate light in the organic light emitting diodes 70 with improved luminance efficiency with respect to power. In addition, simultaneously, the OLED display 101 improves the light extraction rate to minimize light loss during a process through which light emitted from the organic light emitting diode 70 is emitted to the outside through the color filter 230.

Accordingly, the OLED 101 can improve overall use efficiency of light.

Hereinafter, an internal structure of the OLED display 101 will be described in further detail with reference to FIG. 2 and FIG. 3. FIG. 2 is a layout view of a pixel structure of the display substrate 110, and FIG. 3 is a cross-sectional view of the display substrate 110 and the encapsulation substrate 210 of FIG. 2, taken along the line Furthermore, FIG. 3 shows a structure of the third organic light emitting diode 73 among the plurality of organic light emitting diodes 70. Hereinafter, the organic light emitting diodes 70 will be referred to as the third organic light emitting diode 73.

FIG. 2 and FIG. 3 illustrate an active matrix (AM) organic light emitting diode display 101 with a 2Tr-1Cap structure where two thin film transistors (TFTs) 10 and 20 and a capacitor 80 are formed at each pixel, but an exemplary embodiment is not limited thereto. Accordingly, the organic light emitting diode display 101 may have three or more thin film transistors and two or more capacitors per pixel, and a separate wire with various different structures. The pixel is a minimal unit for displaying an image, and is provided at the respective pixel areas. The organic light emitting is diode display 101 displays images through a plurality of pixels.

As shown in FIG. 2 and FIG. 3, the display substrate 110 includes a switching thin film transistor 10, a driving thin film transistor 20, a capacitor 80, and an organic light emitting diode 70, which are formed at each pixel. The structure constructed by the switching thin film transistor 10, the driving thin film transistor 20, and the capacitor 80 is called a driving circuit DC. The display substrate 110 further includes gate (scan) lines 151 arranged in a direction, data lines 171 crossing the gate lines 151 in an insulated manner, and a common power line 172.

A pixel may be defined by taking the gate lines 151, the data line 171, and the common power line 172 as a boundary, but is not limited thereto.

The organic light emitting diode 70 includes the first electrode 710, the organic emission layer 720 formed on the first electrode 710, and the second electrode 730 formed on the organic emission layer 720. Holes and electrons from the first electrode 710 and the second electrode 730 are injected into the organic emissive layer 720. When excitons being combinations of the electrons and the holes shift from an excited state to a ground state, the light emission occurs.

The capacitor 80 has a pair of capacitor electrode plates 158 and 178, and an interlayer insulating layer 160 interposed between the two capacitor electrode plates 158 and 178. The interlayer insulating layer 160 functions as a dielectric. The capacitance is determined depending upon electric charges charged at the capacitor 80 and the voltages applied to the two capacitor electrode plates 158 and 178.

The switching thin film transistor 10 includes a switching semiconductor layer 131, a switching gate electrode 152, a switching source electrode 173, and a switching drain electrode 174. The driving thin film transistor 21 includes a driving semiconductor layer (channel region) 132, a is driving gate electrode 155, a driving source electrode 176, and a driving drain electrode 177.

The switching thin film transistor 10 is used as a switch for selecting pixels to emit light. The switching gate electrode 152 is connected to the gate line 151. The switching source electrode 173 is connected to the data line 171. The switching drain electrode 174 is spaced apart from the switching source electrode 173 by a distance, and is connected to either one of the capacitor electrode plates.

The driving thin film transistor 20 applies a driving voltage to the first (pixel) electrode 710 to excite the organic emissive layer 720 of the organic light emitting diode 70 in the selected pixel. The driving gate electrode 155 is connected to the capacitor electrode plate 158 connected with the switching drain electrode 174. The driving source electrode 176 and the capacitor electrode plate 178 are each connected to the common power line 172. The driving drain electrode 177 is connected to the pixel electrode 710 of the organic light emitting diode 70 through a contact hole.

With the above structure, the switching thin film transistor 10 is operated by the gate voltage applied to the gate line 151, and transmits the data voltage applied to the data line 171 to the driving thin film transistor 20. A voltage with a value corresponding to a difference between the common voltage applied to the driving thin film transistor 20 from the common power line 172 and the data voltage transmitted from the switching thin film transistor 10 is stored at the capacitor 80, and a current corresponding to the voltage stored at the capacitor 80 flows to the organic light emitting diode 70 through the driving thin film transistor 20 to thereby excite the organic light emitting diode 70.

Light generated in the organic light emitting diode 70 is emitted to the outside through the color filter 230 of the encapsulation substrate 210. The plurality of light scattering particles 235 are dispersed in the color filter 230. Accordingly, light extraction efficiency of the light emitted to the outside through the color filter 230 can be effectively improved.

Hereinafter, a second exemplary embodiment will be described with reference to FIG. 4.

Figure 4:
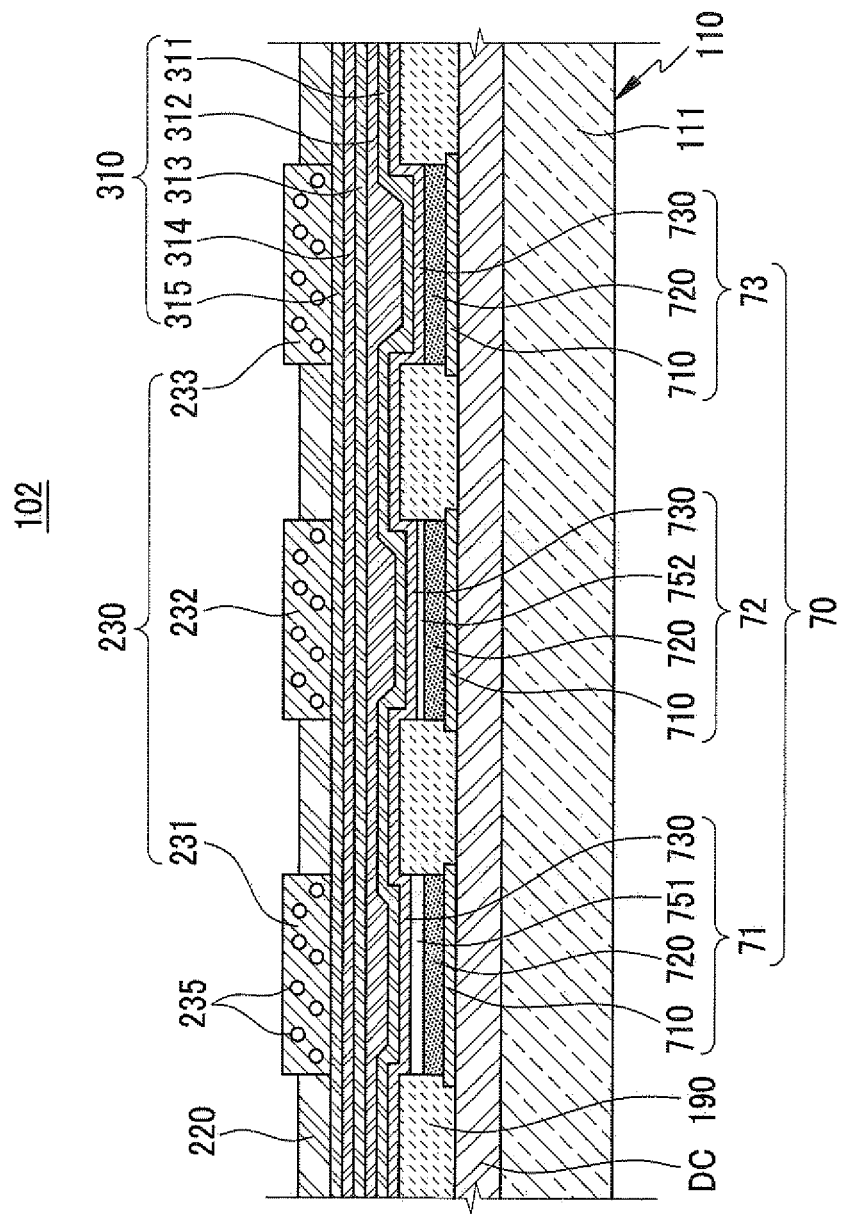
FIG. 4 is a cross-sectional view of an OLED display according to a second exemplary embodiment.

As shown in FIG. 4, an OLED display 102 according to the second exemplary embodiment includes a display substrate 110 including an organic light emitting diode 70, a thin encapsulation layer 310 formed on the display substrate 110, a color filter 230 and a light blocking member 220 that are formed on the thin encapsulation layer 310, and a plurality of light scattering particles 235.

The light blocking member 220 is disposed in a non-pixel area of a first substrate main body 111 corresponding thereto.

That is, the light blocking member 220 faces a pixel defining layer 190 of the display substrate 110.

The color filter 230 is disposed in a pixel area of the first substrate main body 111 corresponding thereto. That is, the color filter 230 faces the organic light emitting diode 70. Furthermore, the color filter 230 has a color of which a base is the same as a color of light emitted from the organic light emitting diode 70.

In further detail, the color filter 230 includes a first color filter 231 facing a organic light emitting diode 71, a second color filter 232 facing a second organic light emitting diode 72, and a third color filter 233 facing a third organic light emitting diode 73. The first color filter 231 has a red-based color, the second color filter 232 has a green-based color, and the third color filter 233 has a blue-based color.

The color filter 230 prevents a light defect due to mixture of external light with light emitted from the organic light emitting diode 70. Furthermore, the light blocking member 220 blocks external light that is unnecessarily incident upon the OLED display 102 from the outside, and is the color filter 230 absorbs unnecessary light of colors excluding the colors of the color filter 230. Therefore, the OLED display 102 formed as a front emission type according to the second exemplary embodiment can effectively suppress reflection of external light through the color filter 230 and the light blocking member 220.

The color filter 230 includes a binder and a pigment. That is, the color filter 230 is formed of a material mixed with the binder and the pigment. Furthermore, the plurality of light scattering particles 235 are dispersed in the plurality of color filters 230. Here, the light scattering particles 235 are formed of a material having a relatively lower refractive index than that of the binder of the color filter 230. The light scattering particles 235 suppress total reflection by scattering light inside the color filter. Therefore, the light scattering particles 235 improve the light extraction efficiency rate by suppressing a light loss due to total reflection when the light emitted from the organic light emitting diode 70 passes through the color filter 230.

The thin encapsulation layer 310 includes at least one of inorganic films 311, 313, and 315, and at least one of organic films 312 and 314. Furthermore, the thin encapsulation layer 310 has a structure in which the inorganic films 311, 313, and 315 and the organic films 312 and 314 are alternately stacked. In this case, the inorganic film 311 is disposed the lowest. That is, the inorganic film 311 is most closely disposed to the organic light emitting diode 73. In FIG. 4, the thin encapsulation layer 310 includes three inorganic films 311, 313, and 315 and two organic films 312 and 314, but the second exemplary embodiment is not limited thereto.

The inorganic films 311, 313, and 315 are formed of an inorganic material including at least one of Al2O3, TiO2, ZrO, SiO2, AlON, AlN, SiON, Si3N4, ZnO, and Ta2O5. Furthermore, the inorganic films 311, 313, and 315 are formed through an atomic layer deposition (ALD) process. The ALD process enables growing of the above-stated inorganic materials at a temperature lower than 100 in such a manner so as to avoid damage to the organic light emitting diode 70. The inorganic films 311, 313, and 315 formed through the ALD process can effectively suppress the permeation of moisture or oxygen because the thin films have high density. However, the second exemplary embodiment is not limited thereto, and the inorganic films 311, 313, and 315 may be formed by various methods that are well known to those skilled in the art.

The organic films 312 and 314 are made of polymer-based materials. The polymer-based materials include acrylic resin, epoxy resin, polyimide, polyethylene, and so forth. The organic films 312 and 314 are formed through a thermal deposition process. The thermal deposition process for forming the organic films 312 and 314 is carried out within a temperature range where the organic light emitting diode 73 may not be damaged. However, the second exemplary embodiment is not limited thereto, and the organic films 312 and 314 may be formed by various methods that are well known to those skilled in the art.

The inorganic films 311, 313, and 315 with high thin film density suppress the permeation of mainly moisture and oxygen. The inorganic films 311, 313, and 315 prevent a large majority of moisture and oxygen from permeating into the organic light emitting diode 70.

The moisture and oxygen having passed through the inorganic films 311, 313, and 315 are blocked again by the organic films 312 and 314. The organic films 312 and 314 have a relatively low moisture permeation prevention effect compared to the inorganic films 311, 313, and 315. However, the organic films 312 and 314 also serve as a buffer layer for reducing stress between the layers of inorganic films 311, 313, and 315 caused by the bending of the organic light emitting display 102, as well as serving to suppress moisture permeation.

That is, if the inorganic films 311, 313, and 315 are consecutively formed directly on each other without the organic films 312 and 314 interposed therebetween, when the organic light emitting display 102 is bent, stress is generated between the inorganic films 311, 313, and 315. Due to this stress, the inorganic films 311, 313, and 315 are damaged, thereby significantly degrading the moisture permeation prevention function of the thin film encapsulation layer 210. As described, the organic films 312 and 314 serve as a buffer layer as well as serving to suppress moisture permeation, so that the thin film encapsulation layer 310 can stably prevent the permeation of moisture or oxygen. Also, because the organic films 312 and 314 have planarization characteristics, the uppermost surface of the thin film encapsulation layer 310 can be planarized.

The thin encapsulation layer 310 can sufficiently guarantee a water vapor transmission rate (WWTR) of less than $10^{-6}$ g/m$^2$/day.

Furthermore, the thin film encapsulation layer 310 can be formed at a thickness of less than 10 μm. Accordingly, compared to the first exemplary embodiment in which the encapsulation substrate 210 of FIG. 1 is used, the overall thickness of the OLED display 102 can be relatively very thin.

With the above configuration, the OLED display 102 according to the second exemplary embodiment can effectively suppress reflection of external light. Simultaneously, the OLED display 102 can generate light in the organic light emitting diode 70 with improved luminance efficiency with respect to power. Furthermore, the OLED display 102 can minimize light loss during a process through which light generated in the organic light emitting diode 70 is emitted to the outside through the color filter 230 by improving light extraction rate.

Accordingly, the OLED display 102 can improve overall use efficiency of light.

Furthermore, the entire thickness of the OLED 102 can be effectively slim.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display comprising:
   a plurality of organic light emitting, diodes disposed on a display substrate, the plurality of organic light emitting diodes including first, second and third organic light emitting diodes, each of the first, second and third organic light emitting diodes comprising a first electrode, an organic emissive layer, and a second electrode, the first organic light emitting diode further comprising a cavity layer disposed between the corresponding second electrode and the corresponding organic emissive layer;
   the second organic light emitting diode having a corresponding cavity layer disposed between the corresponding second electrode and the corresponding organic emissive layer, the cavity layer of the second organic light emitting diode being narrower than the cavity layer of the first organic light emitting diode
   a plurality of color filters corresponding to the plurality of organic light emitting, diodes, the color filters being disposed opposite to the second electrodes;
   a plurality of light scattering particles dispersed in the plurality of color filters; and
   a thin encapsulation layer disposed between the plurality organic light emitting diodes and the plurality of color filters, the plurality of color filters contacting with the encapsulation layer.

2. The organic, light emitting diode display as set forth in claim 1, each of the color filters comprising a binder and a pigment, the light scattering particles being made of a material having a relatively low refractive index compared to the binder.

3. The organic light emitting diode display as set forth it. claim 2, the light scattering particles being comprised of inorganic particles.

4. The organic light emitting diode display as set forth in claim 2, the light scattering particles being comprised of silicon oxide ($SiO_2$).

5. The organic light emitting diode display as set forth in claim 1, further comprising:
   the third organic light emitting diode having the corresponding second electrode formed in contact with the corresponding organic emissive layer.

6. The organic light emitting, diode display as set forth in claim 1, further comprising a transparent encapsulation substrate sealed with the display substrate, the plurality of color filters being disposed on the encapsulation substrate.

7. The organic light emitting diode display as set forth in claim 6, further comprising a plurality of light blocking layers disposed on the encapsulation substrate and formed adjacent to the plurality of color filters.

8. The organic light emitting diode display as set for claim 1, the display substrate further comprising:
   a substrate main body;
   a driving circuit layer disposed on the substrate main body; and
   a pixel defining layer disposed on the driving circuit layer, the pixel defining layer being divided into a plurality of pixel areas spaced apart from each other and a non-pixel area formed around the plurality of pixel areas, the plurality of organic light emitting diodes being respectively disposed at each of the plurality of pixel areas.

9. The organic light emitting diode display as set forth in claim 8, further comprising a. plurality of light blocking layers formed adjacent to the plurality of color filters, the light blocking layers being disposed above the non-pixel area, and the plurality of color filters being disposed above the pixel areas.

10. The organic light emitting diode display as set forth in claim 1, the first organic light emitting diode emitting light of a red-based color, the second organic light emitting diode emitting light of a green-based color, and the third organic light emitting diode emitting light of a blue-based color.

11. The organic light emitting diode display as set forth in claim 1, the thin encapsulation layer comprising at least one inorganic film and at least one of organic film.

12. The organic light emitting diode display as set forth in claim 11, the thin encapsulation layer having a structure in which the inorganic film and the organic film are alternately stacked.

13. The organic light emitting diode display as set forth in claim 11, the inorganic film being disposed on the plurality of organic light emitting diodes.

14. An organic light emitting diode display comprising:
   a plurality of organic, light emitting diodes disposed on a display substrate, the plurality of organic light emitting diodes each having a first electrode, an organic emissive layer, and a second electrode, at least one of the organic light emitting diodes comprising a cavity layer disposed between the corresponding second electrode and the corresponding organic emissive layer and another of said organic light emitting diodes having a cavity layer disposed between the corresponding second electrode and the corresponding organic emissive layer, the cavities having different thicknesses;
   a plurality of color filters corresponding to the plurality of organic. light emitting diodes, the color filters being disposed opposite to the second electrodes;
   a plurality of light scattering particles dispersed in the plurality of color filters; and
   a thin encapsulation layer disposed between the plurality organic light emitting diodes and the plurality of color filters, the plurality of color filters contacting with the encapsulation layer.

15. An organic light emitting diode display as set forth in claim 14, further comprising vet another of said organic light emitting diodes comprising the corresponding second electrode being disposed directly on the corresponding organic emissive layer.

16. The organic light emitting diode display as set forth claim 14, each of the color filters comprising a binder and a pigment, the light scattering particles being made of inorganic particles having a relatively low refractive index compared to the hinder.

17. The organic light emitting diode display as set forth in claim 16, the light scattering particles being comprised of silicon oxide ($SiO_2$).

* * * * *